(12) United States Patent
Blednov (10) Patent No.: US 8,354,882 B2
(45) Date of Patent: Jan. 15, 2013

(54) DOHERTY AMPLIFIER WITH INPUT NETWORK OPTIMIZED FOR MMIC

(75) Inventor: Igor Blednov, Eindhoven (NL)

(73) Assignee: ST-Ericsson SA, Plan-les-Ouates (CH)

( * ) Notice: Subject to any disclaimer, the term of this patent is extended or adjusted under 35 U.S.C. 154(b) by 0 days.

(21) Appl. No.: 13/003,028

(22) PCT Filed: Jul. 1, 2009

(86) PCT No.: PCT/EP2009/058283
§ 371 (c)(1),
(2), (4) Date: May 18, 2011

(87) PCT Pub. No.: WO2010/003865
PCT Pub. Date: Jan. 14, 2010

(65) Prior Publication Data
US 2011/0210786 A1    Sep. 1, 2011

(30) Foreign Application Priority Data

Jul. 9, 2008 (EP) .................................... 08159978

(51) Int. Cl.
*H03F 3/68* (2006.01)
(52) U.S. Cl. .................... 330/124 R; 330/295; 330/302; 330/53
(58) Field of Classification Search ............... 330/124 R, 330/295, 302, 53
See application file for complete search history.

(56) References Cited

U.S. PATENT DOCUMENTS

| | | | |
|---|---|---|---|
| 3,314,024 A * | 4/1967 | Sainton | 332/180 |
| 5,880,633 A * | 3/1999 | Leizerovich et al. | 330/84 |
| 6,020,848 A | 2/2000 | Wallace | |
| 6,940,349 B2 * | 9/2005 | Hellberg | 330/124 R |
| 7,135,931 B2 * | 11/2006 | Prodanov | 330/302 |
| 7,728,662 B2 * | 6/2010 | Apel | 330/124 R |
| 7,800,448 B2 * | 9/2010 | Blednov | 330/295 |
| 7,898,338 B2 * | 3/2011 | Blednov | 330/295 |
| 2004/0185916 A1 | 9/2004 | Chang | |
| 2011/0279178 A1 * | 11/2011 | Outaleb et al. | 330/124 R |

FOREIGN PATENT DOCUMENTS

| | | |
|---|---|---|
| WO | 2006123289 A | 11/2006 |
| WO | 2007122586 | 11/2007 |
| WO | 2007142414 A | 12/2007 |

* cited by examiner

*Primary Examiner* — Patricia Nguyen
(74) *Attorney, Agent, or Firm* — Coats & Bennett, P.L.L.C.

(57) ABSTRACT

In a Doherty amplifier (100), the amplifier's input is connected to a main device (102) via a first branch and to a peak device via a second branch. The first branch has a first frequency-dependent input impedance with a first real part and a first imaginary part. The second branch has a second frequency-dependent input impedance with a second real part and a second imaginary part. The first and second imaginary parts have opposite polarity. The first and 5 second imaginary parts have a same magnitude so as to compensate each other in the frequency band. The first imaginary part and the second imaginary part implement a first phase shift in the. first branch and a second phase shift in the second branch, respectively. The first and second phase shifts each have a magnitude of substantially 45 degrees substantially in the middle of the frequency band and are of opposite polarity. The phase difference of the 10 input signals to the main (102) and peak (104) devices stays largely constant over the frequency band.

9 Claims, 8 Drawing Sheets

Fig. 1

$$(201) \quad Z_{in} = \left(Rg + \frac{g_m(V_{gs})L_s}{C_{gs}(V_{gs})}\right) + j\left(\omega L_s - \frac{1}{\omega C_{gs}(V_{gs})}\right)$$

Fig. 2a (202) $\omega L_0 = 1/(\omega C_{ds}) = Z_0 = R_0$    (206) $f_0 = 1/(2\pi R_0 C_{ds})$ (204) $R_0 = 2(V_{ds} - V_k)/I_d$    (208) $L_0 = R_0/(2\pi f_0)$

Fig. 2b

Fig. 2c $$(203) \quad \frac{G_{p\_main}}{G_{p\_peak}} = \frac{(\sqrt{2}V_{gs\_RF\max} - V_{gs\_bias\_peak})^2 \, \text{Re}/Z_{In\_peak}}{(\sqrt{2}V_{gs\_RF\max} - V_{gs\_bias\_main})^2 \, \text{Re}/Z_{In\_main}}$$

$$(205) \quad \frac{Z_m}{Z_p} = \sqrt{\frac{G_m}{G_p}}$$

DOHERTY AMPLIFIER WITH INPUT NETWORK OPTIMIZED FOR MMIC

FIELD OF THE INVENTION

The invention relates to an electronic circuit comprising a Doherty amplifier for use in a frequency band.

BACKGROUND ART

A classical Doherty amplifier has two amplifying devices arranged in parallel and of the same power capability. The first one of the devices (main stage) operates in a class-AB amplifier mode and the second one (peak stage) operates in a class-C amplifier mode. These devices are separated at their inputs and at their outputs by 90° phase-shifting networks. The output phase-shifting network has a specific characteristic impedance $Z_0$ which must be equal to the optimal load impedance $R_{Lm}$ of the main stage. The phase shifting output network is also known as an "impedance inverter" or a "Doherty combiner". The Doherty combiner is operative to: a) combine the two output signals, b) to correct for phase differences between the two output signals, and c) to provide a load impedance to the output of the main stage that has at any moment in time the inverted value of the load impedance existing at the output of the Doherty amplifier. While the Doherty input power level stays below 0.25 of the maximum (or: 6 dB below maximum) the peak stage remains inactive. Due to the impedance inversion, the main stage operates at load, which is two times higher than the optimal load and equal to $R_{Lm}=2\ Z_0$. This allows higher power efficiency of the main stage, and also of the Doherty amplifier. The double load at the output of the main stage is possible at proper arrangement of the output load $R_{LD}$ of the Doherty amplifier which, for the classical case, is $R_{LD}=\frac{1}{2}Z_0=\frac{1}{2}R_{Lm}$ and which is transformed by the output phase-shifting network to $2\ Z_0=2\ R_{Lm}=4\ R_{LD}$. When the input signal to the Doherty amplifier achieves a certain power level, which ideally is 6 dB below the peak power level for a classical Doherty amplifier, the output voltage of the main stage reaches the maximum RF voltage amplitude resulting in maximum power efficiency and then the peak stage is activated and takes over the amplification. Above this threshold power level, the load impedance as seen by the main stage starts to drop gradually with growing power level until it reaches its optimal value $Z_0$, which occurs at the peak power level of the Doherty amplifier.

A Doherty amplifier is a very attractive candidate for integration in a semiconductor device, due to its simplicity and due to the fact that its operation is involving only an analog-signal processing technique. But this comes at a cost: the development of a Doherty amplifier requires very precise design and presents a real challenge even to highly experienced designers of RF (radio frequency) circuitry. The electrical parameters of the components involved in the Doherty amplifier, e.g., ceramic capacitors and their positions on the printed circuit board (PCB), must be precisely defined at tolerances, which are much smaller than those required for traditional power amplifiers. Also, due to mechanical tolerances, the ground contacts of the main device and of the peak device packages, and their positions between the input microstrip lines and output micro-strip lines of the PCB, are not reproducible precisely enough and add to the phase shift inconsistency and impedance match inconsistency between the two amplification branches. As a result the accuracy of the values of the Doherty amplifier parameters is adversely affected and this causes a lower yield at the production line.

This problem can be handled in several ways. The first traditional approach is the tedious tuning of the Doherty amplifiers at the production line, which takes time and highly experienced electrical engineers and personnel, and is therefore costly. The second approach is precise designing involving good electrical modeling and implementation with components having low tolerance, which also increases production cost. Accordingly, if integrated, the problems related to the electrical and mechanical tolerances as mentioned above will be reduced, and the advantages of a Doherty amplifier reside in a more consistent performance and a lower price in mass production. Then, the quality of an integrated Doherty amplifier mainly depends on a proper design minimizing the parameter spread of the components used and on the parasitic electromagnetic coupling between its components.

Figure 2A:
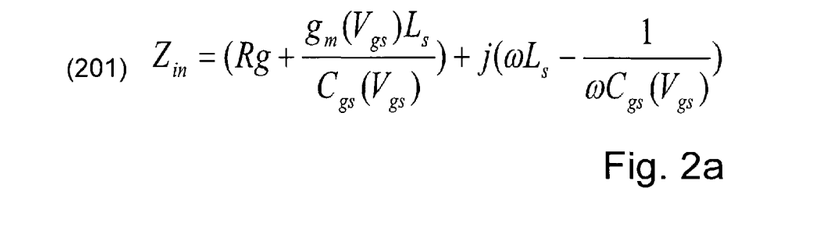
FIGS. 2a, b, c, d give formula related to the Doherty amplifier of FIG. 1.

The very general requirement to guarantee a proper Doherty performance is a precise input power control that involves the control of the amplitude and phase of the input signals as supplied to the inputs of the main device and the peak device. This turns out to be complicated as a result of the non-linearity of the peak stage, operating as a C-class amplifier, that may be characterized as the power dependence of the input impedance and the output impedance. The dependence of the main or peak device's input impedance $Z_{in}$ on the power can be expressed as in formula (201 of FIG. 2a. In formula (201): $g_m(V_{gs})$ is the device's trans-conductance as a function of the RF gate-source voltage $V_{gs}$; $C_{gs}$ is the device's input capacitance as a function of the RF gate-source voltage $V_{gs}$; $L_s$ is the common source inductance of the device; and $R_g$ is the gate resistance. Considering the trans-conductance of the device, one notices that in C-class operation of the device, the trans-conductance varies from zero to its maximum value, thus having a strong impact on the overall value of $Z_{in}$. This dependence of the input impedance on the power requires an adequate design of the input network, or a good isolation between the input port of the main device and the input port of the peak device. A hybrid coupler is generally used for this reason. Such a hybrid coupler, however, implemented made by means of distributed transmission lines or by means of lumped capacitor and inductor elements, is difficult to implement in an MMIC (Monolithic Microwave Integrated Circuit) owing to the lack of space required and typically also owing to the properties of the semiconductor substrate causing high power-losses as in, e.g., Si LDMOS (Laterally Diffused Metal-Oxide Semiconductor) technology.

Figure 1:
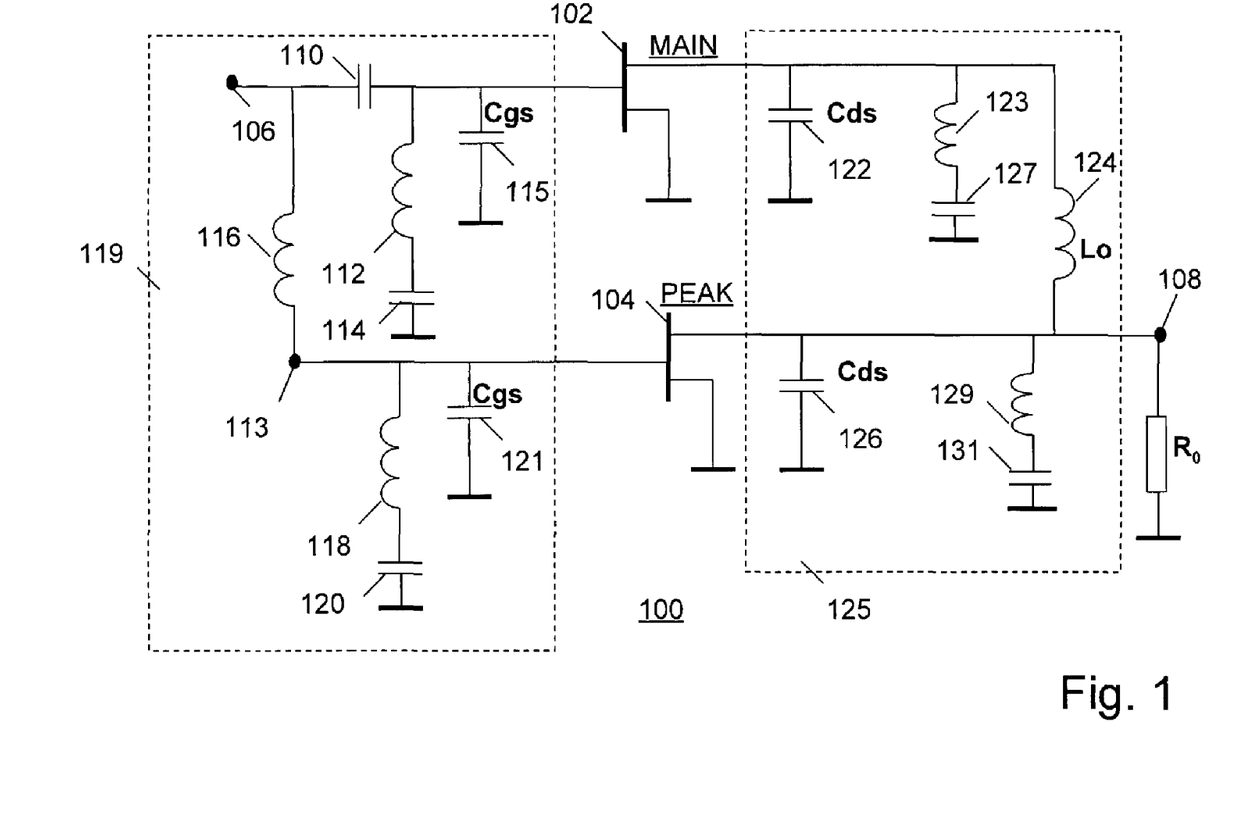
FIG. 1 is a circuit diagram of a known Doherty amplifier.

FIG. 1 is a circuit diagram of a known Doherty cell 100 manufactured in an LDMOS process. Such a cell can be used as a building block to create a high-power Doherty amplifier by means of an array of such cells arranged in parallel. Cell 100 comprises a main device (or: amplifier, or: stage) 102 and a peak device (or: amplifier, or stage) 104 arranged in parallel between an input 106 and an output 108. Input 106 is coupled to the input of main amplifier 102 via an input network comprised of a capacitance 110, an inductance 112, a capacitance 114 and an input capacitance 115 of main device 102. Input 106 is coupled to the input of peak amplifier 104 via an input network comprised of an inductance 116, an inductance 118, a capacitance 120 and an input capacitance 121 of peak device 104. Capacitances 115 and 121 are formed by the respective gate-source capacitances of devices 102 and 104. The combination of these input networks operates as a low-pass filter and provides an input matching for the main device and peak device, requiring a 90° phase shift of the signals, and provides a power distribution. The combination of the input networks is also referred to as an "input combiner", referred to herein with numeral 119. A disadvantage of this known input combiner is the narrowband phase characteristic where the phase shift must be within the 70°-110° range. The frequency band may be increased by 10%-15% by means of introducing losses, but in exchange for the overall power gain of Doherty amplifier 100.

The outputs of main amplifier 102 and of peak amplifier 104 are coupled to output 108 via an output network (or: "output combiner") 125 comprised of a capacitance 122, and inductance 124 and a capacitance 126. Capacitances 122 and 126 are formed by the parasitic drain-source capacitance $C_{ds}$ of amplifier 102 and of amplifier 104, respectively. The output of main device 102 is coupled to signal-ground via a series arrangement of an inductance 123 and a capacitance 127. Similarly, the output of peak device 104 is coupled to signal-ground via a series arrangement of an inductance 129 and a capacitance 131. These series arrangements are convenient for DC-biasing main device 102 and peak device 104, allowing a wide-band video-decoupling, or a so-called "choke". Such a video-decoupling prevents leakage of the RF signal into the power supply network by means of providing a very low, or negligible, impedance at the modulation frequency and a very high impedance, or a practically "open circuit", at the carrier/RF frequency.

Figure 2B:
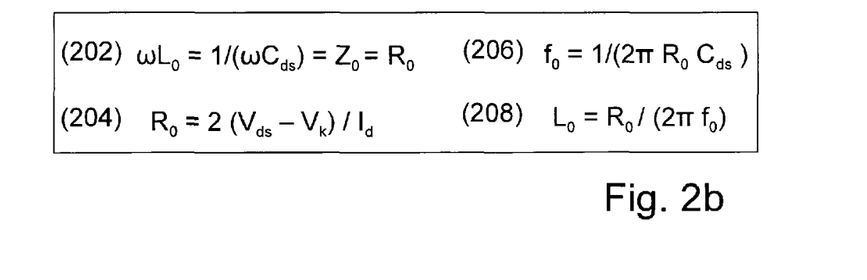

Integrated Doherty amplifiers made with current semiconductor technologies are well suited for use in mobile communication devices in the frequency ranges of PCS (Personal Communications Service), operating in the 1900 MHz range and W-CDMA (Wideband Code Division Multiple Access) located in the 1.8 GHz-2.2 GHz range. This can be seen by considering the low-pass C-L-C output network of capacitances 122 and 126 and inductance 124. This output network is used as output combiner of an integrated symmetrical Doherty amplifier. A well-known basic requirement for a Doherty output network is that it provides the functionality of a quarter-wavelength transmission line of specific characteristic impedance Zo. The value of Zo is chosen to be the optimum load resistance Ro of the main amplifier stage of the Doherty amplifier. The lumped C-L-C network is equivalent to an impedance inverter if properly built so as to comply with expressions (202), (204), (206) and (208) of FIG. 2b. Properly built, the C-L-C network provides a 90° phase shift of the signal and has characteristic impedance Zo, allowing to up to 20% higher operational bandwidth of the Doherty amplifier. This requires that the capacitance value Cds and the inductance value Lo be as given in expression (202) of FIG. 2, wherein co is the angular frequency of the carrier or RF signal. For operating in the GHz ranges, a Doherty amplifier is made in a suitable semiconductors technology, e.g., LDMOS. For example, in LDMOS, the supply voltage Vds is around 28 V-32 V; for the selected size of the main stage device the value of the parasitic drain-source capacitance Cds equals 1.86 pF with a maximum drain current Id of 1.2 A; —and the knee voltage Vk is 4V. The optimum load resistance Ro is then 40 Ohm according to expression (204). The operating frequency fo is given by expression (206) and lies around 2 GHz. The inductance value Lo needed is given by expression (208) and equals 2.95 nH for 2.14 GHz, or slightly more at 1.8 GHz. In an example embodiment, inductances 112 and 118 of the input network are integrated in the silicon substrate, and inductances 116 and 124 are formed with bonding wires.

Accordingly, for applications in the 2 GHz range, such as PCS and W-CDMA, this implementation of a Doherty amplifier can be used in Si-LDMOS. However, due to demand for a larger relative frequency band for modern mobile communication system operating at 1 GHz, and for WiMax (Worldwide Interoperability for Microwave Access) for the bands of 2.5 GHz-2.7 GHz and 3.4 GHz-3.8 GHz, this Doherty amplifier is less suitable without further modification. The disadvantage is that the 90° phase shift of the input network needs to be less dependent on frequency and power.

SUMMARY OF THE INVENTION

As mentioned above, the input impedance of an LDMOS device, and also of any other type of power device operating in C-class, depends on the input power level. Doherty amplifiers of traditional design make use of an input power divider with port isolation to diminish the negative effect of the variable input impedance of the C-class peak device. Implementation of a high-quality power-divider in MMIC is difficult, due to substrate losses and limited space available. According to measurements, the imaginary part of the input impedance of an LDMOS device varies more strongly with the input power level than the real part does. Without port isolation this causes a power-dependent phase shift of the input network, and also a power-dependent power split ratio. As a result, a non-optimal output power combining occurs at the output of the Doherty system, that in turn causes a loss of back-off efficiency and/or of linearity and peak power capability. This may seriously hamper the performance of the Doherty amplifier in the sense that such characteristics like efficiency, linearity and/or power capability, cannot be optimized individually without adversely affecting the other.

For example, the phase difference between the inputs and the outputs of the main stage and of the peak stage may assume values of up to 30° as a function of the input and output power levels. A 30° phase mismatch between the input and output of the Doherty amplifier causes power losses of about 0.3 dB and a loss in efficiency of about 3%. Substantial phase differences occur especially during the peak stage becoming active (i.e., when it is being turned on). Also, the phase characteristic of the input network is more frequency dependent than that of the output low-pass C-L-C Doherty combiner, thus limiting the Doherty operational frequency bandwidth. This parameter can be improved up to some level in exchange for compromising the gain of the Doherty amplifier, by introduction of losses at the input of the Doherty amplifier, which make the dependence of the input phase shift on power and frequency less pronounced.

Monte-Carlo analysis carried out by the inventor shows that spread of parameter values of components at the input of the main stage and of the peak stage is a major factor degrading Doherty performance. This issue is especially important if the input network of the Doherty system does not provide isolation between the main and peak devices. Such a network must properly control the signals' phases and amplitudes between the devices.

Figure 2C:
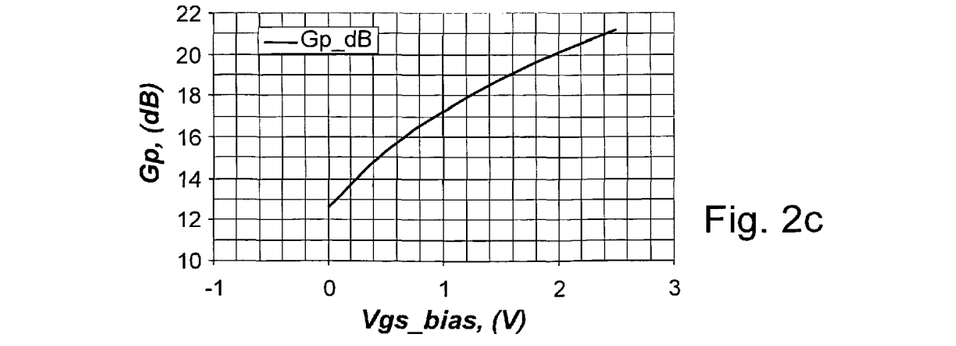
FIG. 2c is a diagram illustrating the dependence of the gain at peak power on the bias for an LDMOS power device.

Research of the optimal power division issue in a Doherty system in general has shown that the optimal ratio of the input power, as delivered to the main device, to the input power, as delivered to the peak device, depends on the gate bias, or conduction angle (as is known in the art, the expression "conduction angle" refers to that portion of an input sine-wave cycle during which a load current flows in a transistor), of the peak device operating in C-class. The deeper the C-class, or the smaller the conduction angle, of the peak device, the larger is the difference required between the magnitudes of input power as split between the main and peak devices. This is because the power gain of a device operating in C-class is always lower than that of the device operating in AB-class. FIG. 2c is a diagram illustrating this dependence of the gain at peak power on the bias for an LDMOS power device.

The publication "A new high-efficiency power amplifier for modulated waves" by W. H. Doherty, dealing with vacuum tubes, and WO2004/017512 published for the current inventor, do not consider the conditions, under which optimal Doherty amplifier operation can be achieved, without use of an input power splitter with port isolation. As a matter of fact, this is not an issue for vacuum tube operating at low frequencies. However, semiconductor power devices have significant variation of input impedance versus power level. As a result, input power division between the main device and peak device is important. Understanding and proper handling of this issue allows an optimal Doherty amplifier operation, delivering best peak power capability, linearity and back-off efficiency. A difference in power division or power ratio must compensate the power gain (Gp) difference between the two devices. Expression (203) in FIG. 2d specifies this relationship between peak device bias and optimal power division ratio. In expression (203), the quantity "$V_{gs\_RF_{max}}$" stands for the magnitude of the voltage of the input signal across $C_{gs}$ of the relevant FET; the quantity "$V_{gs\_bias}$" stands for the gate-bias DC voltage of the relevant FET; and the quantities "$Re/Z_{in\_main/peak}$" stand for the real part of input impedance of the main FET and of the peak FET, respectively, at the operational frequency.

Figure 2D:
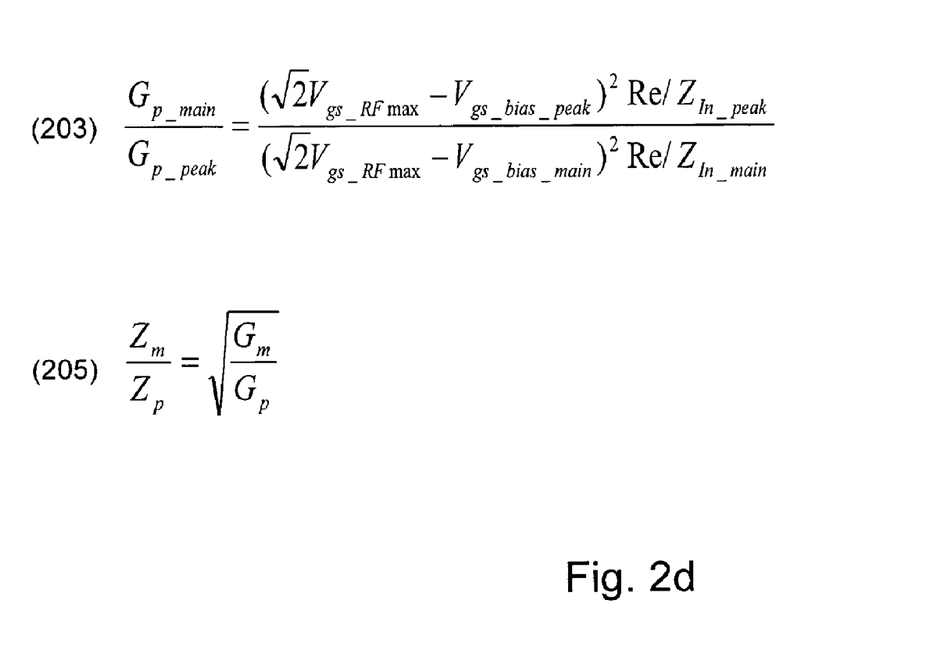

Expression (203) illustrates that Doherty amplifier design should take into account the conduction angle of the peak device. If an integrated Doherty amplifier is realized according to the teachings of W. Doherty and WO2004/017512, using integrated lumped-element low-pass filter artificial lines at the input and the output, it will suffer from loss of power at the input of the peak device, and from power-dependent phase-shifts and power-dependent input power division. As explained above, this is caused by the power-dependent input impedance, both real and imaginary parts, of the semiconductor peak device operating in C-class. The power-dependent input impedance is translated by the input low-pass artificial line to the input of the Doherty amplifier and in this case also to the input of the main device, thus affecting power division at the input of the Doherty system. The amplifier proposed by W. Doherty addressed vacuum tube amplifiers, operating at lower frequency band and exhibiting constant input impedance operating in C-class.

In the general case, the design requirements for an input network of a classical symmetrical Doherty amplifier are as follows. At equal input network losses of the main device and the peak device, the value of the input impedance $Z_m$ of the network connected between common Doherty input 106 and the input of main device 102 (see the relevant components of input combiner 119 of FIG. 1) is related to the value of the input impedance $Z_p$ of the network connected between Doherty input 106 and the input of peak device 104 (see the relevant components of input combiner 119) according to expression (205) of FIG. 2d. The power gain of the peak device and of the main device may be estimated experimentally or via expression (203).

The Code Division Multiple Access mobile systems, such as WCDMA, WiMAX and LTE, are using wideband modulations (of up to 200 MHz), which impose challenging requirements on the linearity. A significant part of the distortions in the final stages of the transmitters is caused by electrical memory effects, which are the most difficult to correct. As known, the expression "memory effects" refers to the changes in amplitude and/or phase in the distortion of a signal, owing to previous signals. They are usually caused by variations of the DC power supply at the power device terminal, e.g., during an output power surge. These DC supply variations appear at a node, where the power supply choke is connected to the output of the power device. The reason for this is that the equivalent inductance of the choke is too high for the particular device and for the selected modulation frequency band. This issue can be solved by connecting the power supply to the node in the power device, where a minimal inductance separates the drain (or collector in a bipolar embodiment) and the connection point. Accordingly, an output shunt compensation inductance of the device (or post-match, or a so-called INSHIN) is very suitable for the concept implementation. It allows a minimal inductance, and therefore the widest modulation frequency band with minimal electrical memory effects or distortions.

A commonly used traditional solution for a power device supply network explores a quarter-wave line with one end connected to the terminal of the power device and with other the end connected to system's common power supply, grounded by large capacitance. This line itself presents a relatively large inductance at the frequency of the modulations. As a result, a bandwidth can be obtained of no more than 20 MHz, with quite exceptional efforts from the designer. The physical length of this line is inversely proportional to the frequency of operation, so with lowering of the frequency it requires more space and just increases an undesirable equivalent inductance.

It is possible to reduce electrical memory effects by means of realizing low impedance and a smooth phase characteristic for the power supply networks of the amplifier (in other words: realizing a so-called wide band high-frequency video-decoupling). Traditionally, a network of an LC low-pass filter configuration is used for video-decoupling. A proper network of this kind is very difficult to design for wide-bandwidth applications owing to the appearance of parasitic parallel resonances that cannot be avoided. An ideal solution would be a network consisting of just a single L-C step, wherein L has a value close to zero and C has a value that approaches infinity. A practical solution, close to the ideal one, is a parallel inductance that is used as a matching component located close to drain or to the gate of the FET in the main stage or the peak stage. If this inductance is grounded through large capacitance, the node between the inductance L and capacitance C can be used for power supply of the device providing the smallest memory effects. Simulation indicates that in this way the value of inductance 116 can be dramatically decreased from 3.5 nH per 150 W device provided by the traditional solution, to just 0.2 nH for the same power device manufactured in LDMOS using the aforementioned practical solution.

A further issue, as explained above, is that the phase characteristics of the input combiner and the output combiner are to be substantially identical in the frequency band of interest in order to obtain good performance in that band. For a low-pass configuration of the input power splitter, this requirement can be met if relatively high losses are introduced at the input power splitting structure, which will also result in loss of power gain.

The invention is defined by the independent claims. Dependent claims define advantageous embodiments.

Accordingly, the inventor now proposes an input power distribution network, which is suitable for an MMIC environment, and proposes a circuit as specified by claim 1. This approach now makes it possible to create a phase difference between the signal at the input node of the main device and the signal at the input node of the peak device that is largely independent of the frequency over the frequency band of interest. From another point of view, this approach enables to have the imaginary parts of the impedances in the input combiner at least partially compensate each other at the common input of the Doherty system over the frequency band, thus at least reducing frequency dependence.

Substantially identical phase-frequency responses of the input combiner and the output combiner can be obtained, while limiting loss of input power and gain, if the main stage and peak stage receive their input signals through phase shifts of opposite polarity and of the same magnitude of 45°, at the central frequency of the operational band. Although this is not the case at the lower and upper frequency of the operational band, the delivered phase difference of the signal will stay close to the desired 90° within the entire band.

BRIEF DESCRIPTION OF THE DRAWING

The invention is explained in further detail, by way of example and with reference to the accompanying drawing, wherein.

Throughout the Figures, similar or corresponding features are indicated by same reference numerals.

DETAILED EMBODIMENTS

As known, a classical Doherty amplifier has two amplifying stages arranged in parallel and of the same power capability. The first one of the stages (main stage) operates in a class-AB amplifier mode and the second one (peak stage) operates in a class-C amplifier mode. These stages are separated at their inputs and at their outputs by 90° phase-shifting networks. The output phase-shifting network has a specific characteristic impedance $Z_0$ which must be equal to the optimal load impedance $R_{Lm}$ of the main stage. The input signal is split so as to drive the two amplifiers, and a summing network, known as an "impedance inverter" or a "Doherty combiner", is operative to: a) combine the two output signals, b) to correct for phase differences between the two output signals, and c) to provide an inverted impedance at the output of the Doherty amplifier with respect to the impedance as seen from the output of the main stage.

In the embodiment of FIG. 1, the state of the art integrated Doherty schematic is shown implemented as follows. Main stage 102 receives its input signal via a capacitance 110, which carries out two functions: 1) as a DC-blocking capacitor separating the DC gate-bias of main device 102 from peak device 104, and 2) to provide signal attenuation at the input of main device 102, allowing a proper input power division between main device 102 and peak device 104. Inductance 112 provides an input impedance transformation of main device 102 to the required level by partial tuning-out of input capacitance $C_{gs}$. Inductance 112 is grounded through capacitance 114. Together, components 110, 112 and 115 provide an input impedance $Z=1-j*1$ as seen from node 106 (normalized values) in the conventional configuration. Components 118, 120, and 121 at the input of peak device 104 similarly provide a similar input impedance transformation of peak device 104 to $Z=1-j*1$ as seen from node 113. In this manner, a capacitive input impedance of both devices 102 and 104 is arranged, representing an input phase shifter of a low-pass filter (C-L-C) configuration by combining them with inductance 116. Accordingly, the required delay of the signal, or a 90° phase shift, is implemented between the inputs of devices 102 and 104. The dimensioning is achieved by proper selection of inductance values and capacitance values of input combiner 119. Similarly, inductance 124 in output combiner 125 provides a −90° phase shift between the output of main device 102 and output 108, thus restoring the phase relationship between the signals at the outputs of main device 102 and peak device 104. A disadvantage of conventionally tuned input network 119 is a relatively high value of inductance 116, which increases the quality factor of input network 119 and the rate of phase deviation versus frequency. The relatively high value of inductance 116 downgrades the useful frequency band of the known Doherty configuration. Another disadvantage of input network 119 is that it acts as an impedance inverter too, and the variation of the input impedance of peak device 104 as a function of the power level affects the input power division at common input 106, again degrading performance of the Doherty system. At back-off power below −6 dB, the real part of the input impedance of peak device 104 is small, which makes the equivalent input impedance of the device high. It is transformed to the Doherty input 106 as low impedance, and affects power division ratio and phase shift within the (−6 dB-0 dB) power range. As a result, it allows a larger portion of the Doherty input power to be channeled to peak device 104 at −6 dB back-off than at peak power, which in turn triggers device 104 into an ON state earlier than required. This effect somewhat degrades the back-off efficiency of the system, not allowing it to achieve the best performance.

As addressed above, the invention resides in configuring the input networks to main and peak devices 102 and 104 (i.e., input combiner 119) in such a manner so as to render a phase difference between the signal at the input node of the main stage and the signal at the input node of the peak stage largely independent of the frequency over the frequency band of interest, and less dependent on input power level. This is achieved by tuning the imaginary part of the impedance between input 106 and main stage 102 and the imaginary part of the impedance between input 106 and peak stage 104 so as to have opposite polarity, and substantially equal magnitude of 45° at the middle of the frequency band of interest. The phase shifts vary with frequency over the frequency band, but the variations have the same polarity and have similar magnitude for both phase shifts, thus maintaining a total of 90° over the entire frequency band.

In the circuit configuration of FIG. 1, the invention is implemented as follows. Main stage 102 receives its input signal via a high-pass filter configuration (including capacitance 110) in the input combiner, and the peak stage receives its input signal via a low-pass filter configuration (including inductance 116) in the input combiner. In the embodiment of FIG. 1 according to the invention, the high-pass filter is dimensioned so as to implement a phase shift of +45° between input 106 and main stage 102; and the low-pass filter is dimensioned so as to implement a phase shift of −45° between input 106 and peak stage 104. The dimensioning is achieved by proper selection of inductance values and capacitance values of the input combiner in FIG. 1, together with selecting the required impedance ratio according to expressions (203) and (205). The proper values and the relationship between $Z_m$ and $Z_p$ are also selected by adding losses of compensation inductances, which affect the quality factor and the resulting equivalent impedances of main device 102 and peak device 104. Inductance 124 provides a −90° phase shift between the output of main device 102 and output 108, thus restoring the phase relationship between the signals at the outputs of main device 102 and peak device 104.

Figure 3:
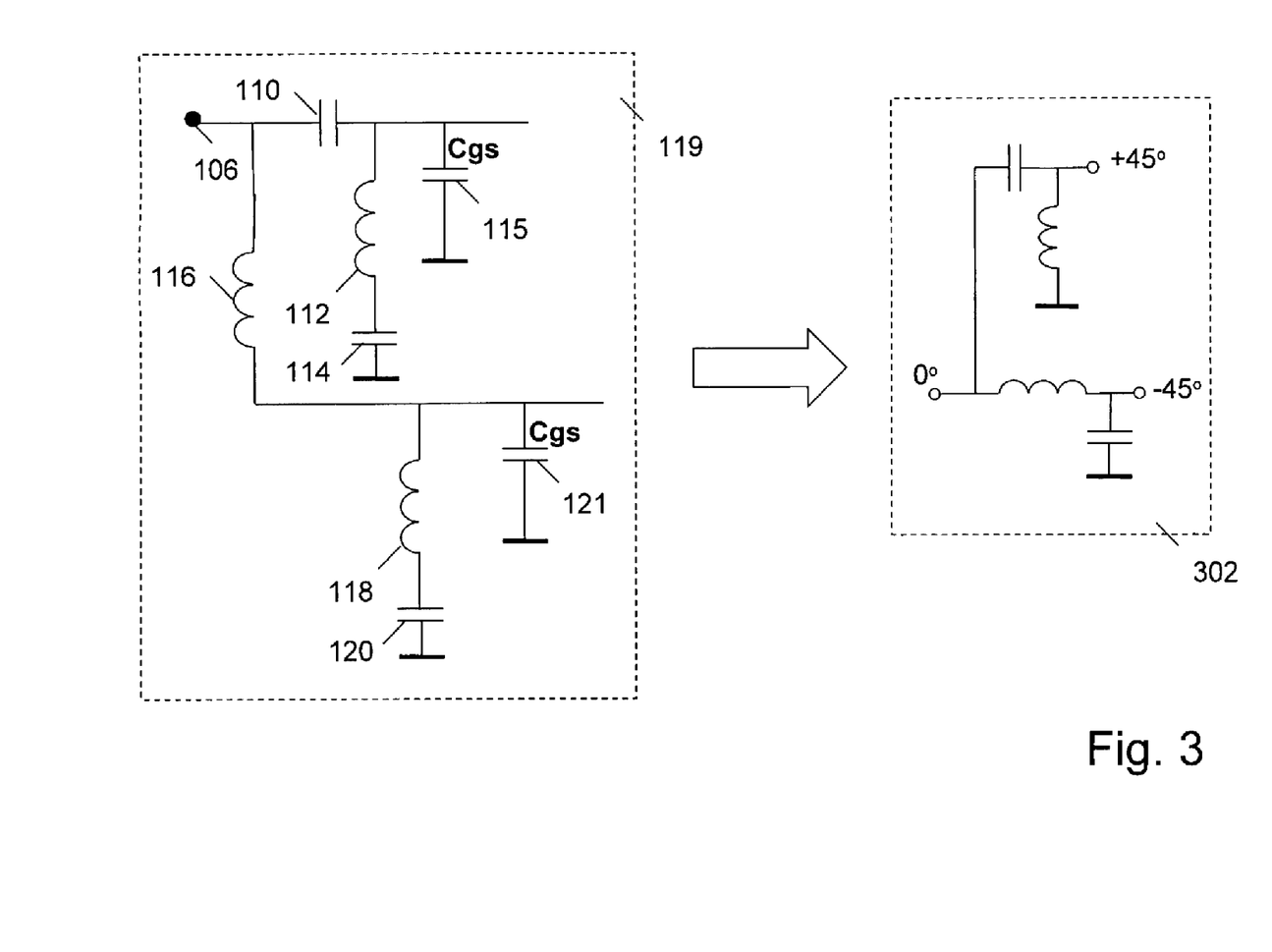
FIG. 3 is a diagram showing the input combiner of the Doherty amplifier in the invention.

FIG. 3 is a circuit diagram giving a functional equivalent circuit 302 of a properly dimensioned input combiner 119.

Figure 4:
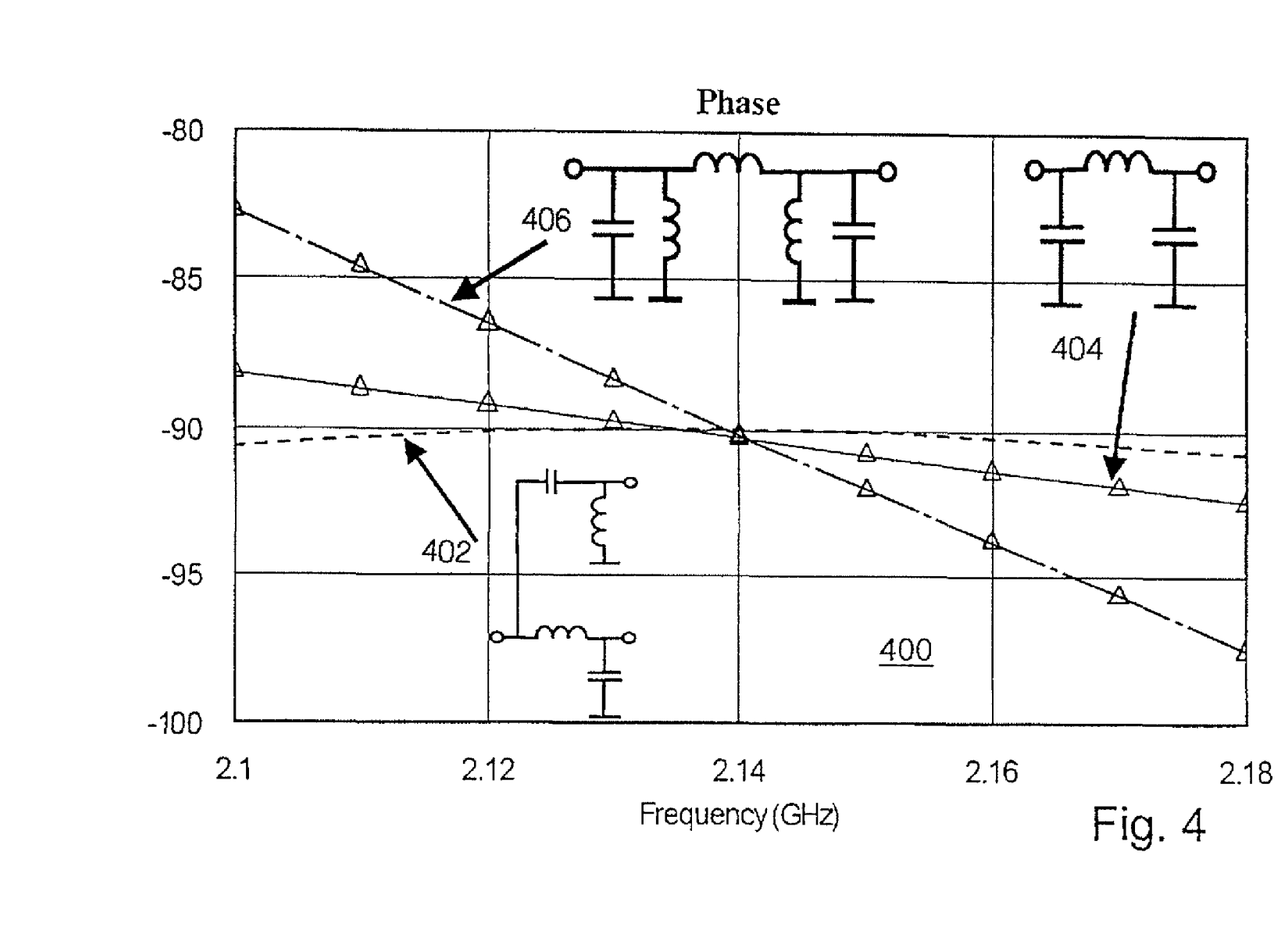
FIG. 4 is a diagram illustrating the phase differences at the inputs of the main and peak devices and the phase differences at the outputs of the devices.

FIG. 4 is a diagram 400 illustrating the variation of the phase differences at the inputs and outputs of main stage 102 and peak stage 104 over a range of frequencies, in the circuit of FIG. 1 when properly configured and tuned according to the invention. Curve 402 indicates the phase difference between the inputs of main stage 102 and peak stage 104 using the invention, in a WCDMA frequency range from 2.1 GHz to 2.18 GHz. Note that curve 402 is almost flat within the whole frequency range. A curve 404 shows the phase difference between the outputs of main stage 102 and peak stage 104 in the C-L-C output combiner discussed above. Curve 404 deviates slightly more from the flat than curve 402 does, but can still be regarded flat within an accuracy of 2° over the frequency range indicated. A curve 406 indicates the behavior of the known input network (i.e., without selecting the component parameter values so as to implement the +/−45° approach as discussed above). Clearly, curve 406 deviates substantially more from the desired flat behavior.

Figure 5:
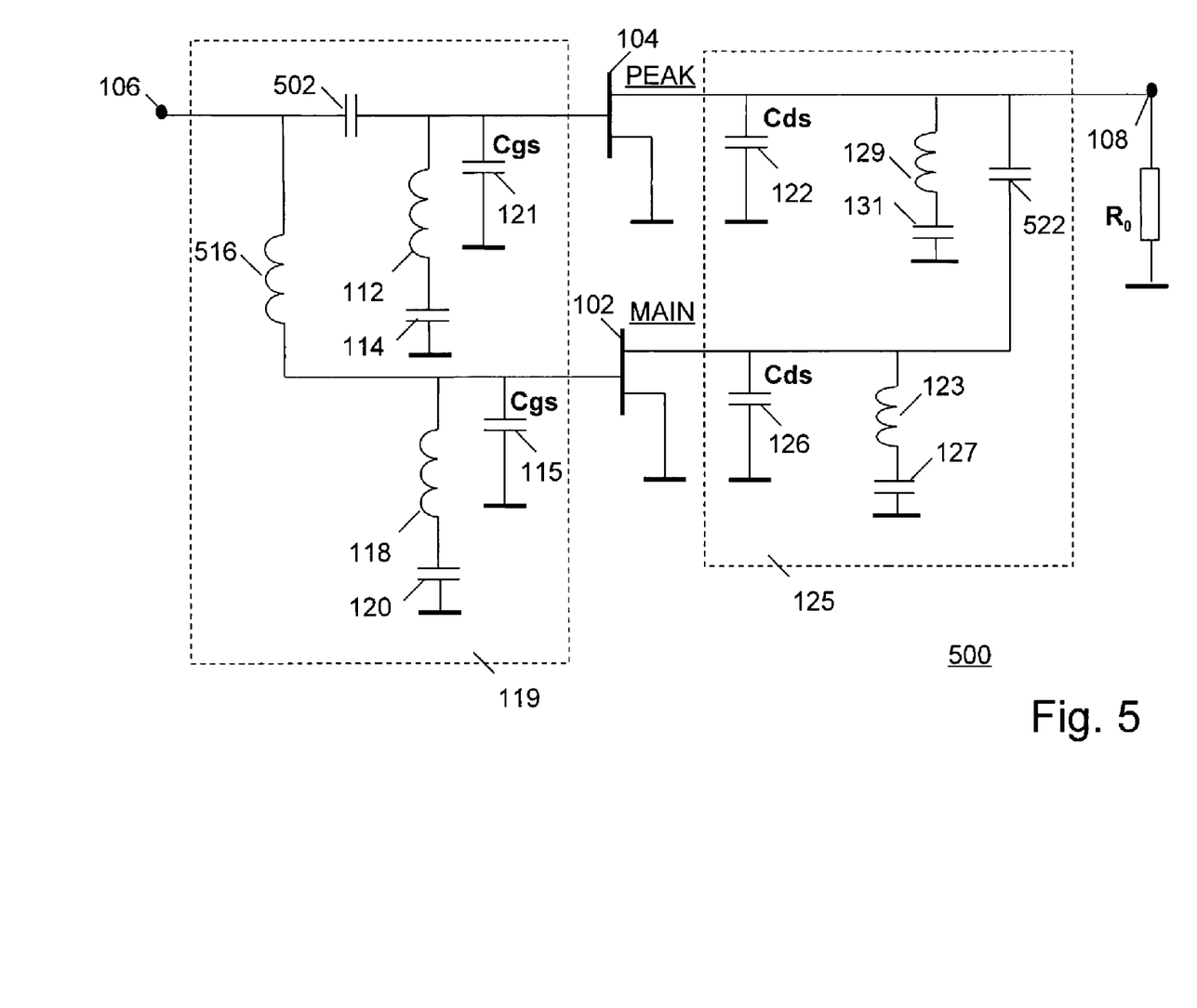
FIG. 5 is a diagram of another Doherty amplifier.

FIG. 5 is another circuit diagram of a Doherty cell 500. Input combiner 119 comprises a capacitance 502 between input 106 and the input of peak stage 104; and an inductance 516 between input 106 and the input of main stage 102 thus forming, together with components 112, 114, 115, 118, 120, and 121, a low-pass filter between input 106 and main stage 102, and a high-pass filter between input 106 and peak stage 104. Note the difference with respect to circuit 100, wherein there is a high-pass filter between input 106 and main stage 102, and a low-pass filter between input 106 and peak device 104. As the phase difference between the input signals to main stage 102 and peak stage 104 are reversed from that in circuit 100, output combiner 125 is configured differently as well (low-pass to high-pass network). Output combiner 125 comprises a capacitance 522 connecting the output of main stage 102 to output 108 and to the output of peak stage 104. Capacitance 522 implements a phase difference of +90° between the output of main device 102 and the output of peak device 104. As in configuration 100, capacitances 114 and 120 serve as nodes to bias the gates of main device 102 and peak device 104, respectively, and capacitances 127 and 131 serve in DC-biasing main stage 102 and peak stage 104.

The impedance values of input combiner 119 are selected so as to provide, at the central frequency in the band of interest, a −45° phase shift between input 106 and the input of main device 102, and a phase shift of +45° between input 106 and the input of peak device 104. Output combiner 125 provides a phase shift of +90° between the output of main device 102 and output 108 via capacitance 522, thus restoring the phase relationship between the output signals of main device 102 and peak device 104.

Figure 6:
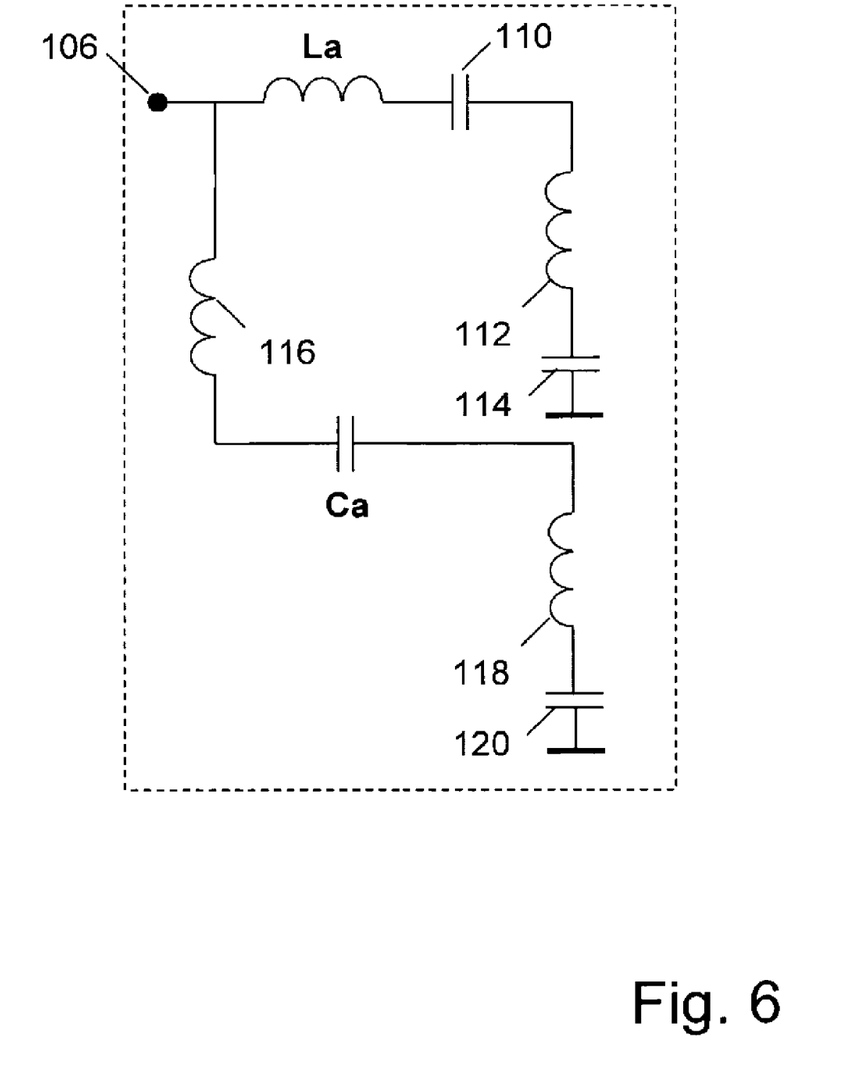
FIG. 6 is another embodiment of the Doherty amplifier.
Figure 7:
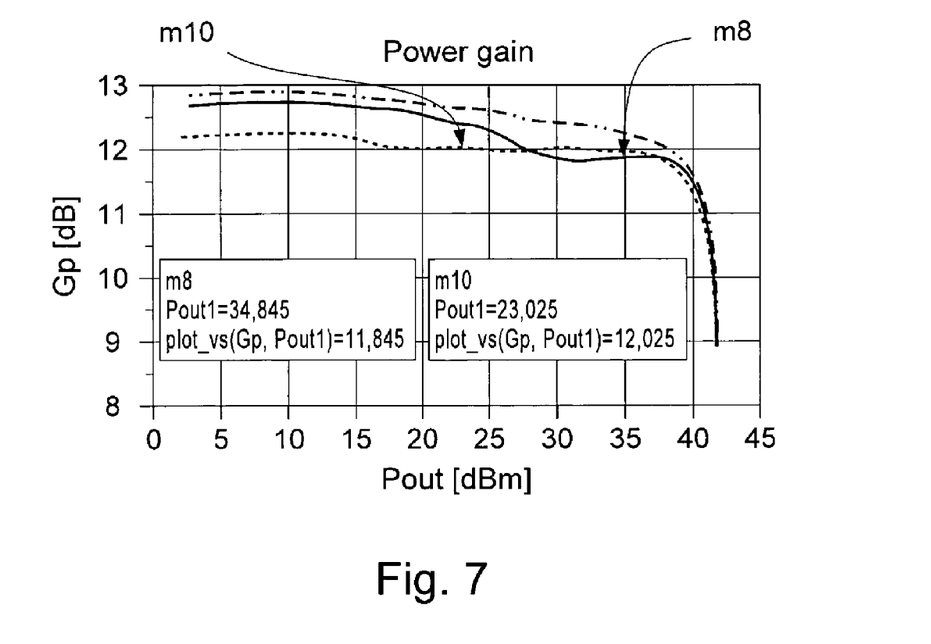
FIG. 7 is a diagram of the transfer function of the Doherty amplifier.

FIG. 6 depicts another embodiment of the Doherty amplifier. It has been surprisingly found that adding an additional inductor and/or an additional capacitor to the first and second branch, respectively determines a substantial increase in linearity of the Doherty amplifier as depicted in FIG. 7. Plots of simulated Gain and Efficiency vs Pout and frequency are presented in 500 MHz bandwidth, demonstrating enormous frequency band of operation at less than 1 dB Gain frequency response; and this in comparison with the state of the art Doherty amplifiers, which show just 100 MHz bandwidth.

It is remarked that the scope of protection of the invention is not restricted to the embodiments described herein. Neither is the scope of protection of the invention restricted by the reference numerals in the claims. The word "comprising" does not exclude other parts than those mentioned in the claims. The word "a(n)" preceding an element does not exclude a plurality of those elements. Means forming part of the invention may both be implemented in the form of dedicated hardware or in the form of a programmed purpose processor. The invention resides in each new feature or combination of features.

The invention claimed is:

1. An electronic circuit comprising a Doherty amplifier for use in a frequency band, wherein the Doherty amplifier comprises:
   an input operative to receive an input signal;
   an output operative to supply an output signal;
   a main device interposed between the input and the output;
   a peak device interposed between the input and the output; and
   an input combiner connecting the input to an input node of the main device and to an input node of the peak device, the input combiner comprising
      a first branch between the input and the input node of the main device so as to implement a first frequency-dependent input impedance with a first real part and a first imaginary part as considered from the input node; and
      a second branch between the input and the input node of the peak device so as to implement a second frequency-dependent input impedance with a second real part and a second imaginary part as considered from the input node;
   wherein the first and second imaginary parts have opposite polarity;
   wherein the first and second imaginary parts have substantially a same magnitude so as to substantially compensate each other in the frequency band;
   wherein the first imaginary part and the second imaginary part implement a first phase shift in the first branch and a second phase shift in the second branch, respectively; and
   wherein each of the first and second phase shifts varies with frequency over the frequency band, but has opposite polarity and similar magnitude, thus mitigating frequency-dependent variations in input impedance at the main and peak devices; and
   wherein each of the first and second phase shifts has a magnitude of substantially 45 degrees substantially in the middle of the frequency band.

2. The circuit of claim 1,
   wherein the first branch comprises:
      a capacitance connected between the input and the input node of the main device;
      a first inductance connected to the input node of the main device and coupled to signal ground; and
      a first input capacitance of the main device; and
   wherein the second branch comprises:
      a second inductance connected between the input and the input node of the peak device;
      a third inductance connected to the input node of the peak device and coupled to signal ground; and
      a second input capacitance of the peak device.

3. The circuit of claim 2 wherein the first branch further comprises an additional inductor coupled between the input node and the capacitance.

4. The circuit of claim 2 wherein the second branch further comprises an additional capacitor coupled between the first inductance and the second inductance.

5. The circuit of claim 1,
wherein the first branch comprises:
   a first inductance between the input and the input node of the main device;
   a second inductance connected to the input node of the main device and coupled to signal ground; and
   a first input capacitance of the main device; and
wherein the second branch comprises:
   a first capacitance between the input and the input node of the peak device;
   a third inductance connected to the input of the peak device and coupled to signal ground; and
   a second input capacitance of the peak device.

6. The circuit of claim 5 wherein the first branch further comprises an additional inductor coupled between the input node and the capacitance.

7. The circuit of claim 5 wherein the second branch further comprises an additional capacitor coupled between the first inductance and the second inductance.

8. The circuit of claim 1 wherein the Doherty amplifier is fabricated in LDMOS.

9. A wireless communication device, including a Doherty amplifier operative to amplify wireless communication signals in a frequency band, the amplifier comprising:
   an input operative to receive an input signal;
   an output operative to supply an output signal;
   a main device interposed between the input and the output;
   a peak device interposed between the input and the output; and
   an input combiner connecting the input to an input node of the main device and to an input node of the peak device, the input combiner comprising
      a first branch between the input and the input node of the main device so as to implement a first frequency-dependent input impedance with a first real part and a first imaginary part as considered from the input node; and
      a second branch between the input and the input node of the peak device so as to implement a second frequency-dependent input impedance with a second real part and a second imaginary part as considered from the input node;
   wherein the first and second imaginary parts have opposite polarity;
   wherein the first and second imaginary parts have substantially a same magnitude so as to substantially compensate each other in the frequency band;
   wherein the first imaginary part and the second imaginary part implement a first phase shift in the first branch and a second phase shift in the second branch, respectively; and
   wherein each of the first and second phase shifts varies with frequency over the frequency band, but has opposite polarity and similar magnitude, thus mitigating frequency-dependent variations in input impedance at the main and peak devices; and
wherein each of the first and second phase shifts has a magnitude of substantially 45 degrees substantially in the middle of the frequency band.

* * * * *